(12) United States Patent
Lim et al.

(10) Patent No.: US 7,684,236 B2
(45) Date of Patent: Mar. 23, 2010

(54) SEMICONDUCTOR DEVICE USING MAGNETIC DOMAIN WALL MOVEMENT

(75) Inventors: Chee-kheng Lim, Yongin-si (KR);
Eun-sik Kim, Yongin-si (KR);
Sung-chul Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 120 days.

(21) Appl. No.: 11/714,823

(22) Filed: Mar. 7, 2007

(65) Prior Publication Data

US 2008/0014424 A1 Jan. 17, 2008

(30) Foreign Application Priority Data

Jul. 13, 2006 (KR) .................... 10-2006-0065863

(51) Int. Cl.
*G11C 11/14* (2006.01)
(52) U.S. Cl. .................. 365/171; 365/173; 365/148; 365/158; 977/933
(58) Field of Classification Search ................ 365/158, 365/189.011, 189.07, 148, 171, 173, 48, 365/66, 78, 80–87, 100, 225.5, 243.5; 257/421, 257/E21.665; 438/3; 977/933–935
See application file for complete search history.

(56) References Cited

U.S. PATENT DOCUMENTS 4,786,553 A 11/1988 Shiroishi et al.
6,713,195 B2 * 3/2004 Wang et al. ............... 428/811.2
6,834,005 B1 12/2004 Parkin
2005/0078509 A1 * 4/2005 Parkin ......................... 365/158

FOREIGN PATENT DOCUMENTS

CN 87 1 03212 A 10/1987

OTHER PUBLICATIONS

Determination of the magnetic damping constant in NiFe films, by G. M. Sandlera, et al., Journal of Applied Physics vol. 85, No. 8 Apr. 15, 1999, pp. 5080-5082.*
Structure and Magnetic Properties of High-Moment Films, by C. Alexander et al., University of Alabama Center for Materials for Information Technology, Nov. 2001.*
Extrinsic contribution to Gilbert damping in sputtered NiFe films by ferromagnetic resonance, B. Kuanr et al., Journal of Magnetism and Magnetic Materials 286, Oct. 13, 2004, pp. 276-281.*
Othmar Ertl et al., "Influence of the Gilbert damping constant on the flux rise time of write head fields", Journal of Magnetism and Magnetic Materials, Dec. 16, 2004, pp. 518-521.
Liu Xingmin et al., "Doping Cobalt to Improve ΔH of $NiFe_2O_4$", Apr. 26, 2003, pp. 67-70.

* cited by examiner

*Primary Examiner*—Vu A Le
*Assistant Examiner*—Harry W Byrne
(74) *Attorney, Agent, or Firm*—Sughrue Mion, PLLC

(57) ABSTRACT

A semiconductor device to which magnetic domain wall movement is applied is provided. The semiconductor device includes a magnetic substance film in which magnetic domain walls are moved, and the magnetic substance film has a damping constant of 0.015 to 0.1.

14 Claims, 3 Drawing Sheets

SEMICONDUCTOR DEVICE USING MAGNETIC DOMAIN WALL MOVEMENT

CROSS-REFERENCE TO RELATED PATENT APPLICATIONS

This application claims priority from Korean Patent Application No. 10-2006-0065863, filed on Jul. 13, 2006, in the Korean Intellectual Property Office, the disclosure of which is incorporated herein in its entirety by reference.

BACKGROUND OF THE INVENTION

1. Field of the Invention

The present invention relates to a semiconductor device and, more particularly, to a semiconductor device to which magnetic domain wall movement is applied.

2. Description of the Related Art

Data storing devices are divided, for the most part, into volatile data storing devices that lose all recorded data when power is turned off and non-volatile data storing devices that keep data even when power is turned off.

Non-volatile data storing devices include a hard disc drive (HDD) and a non-volatile random access memory (RAM). The HDD includes a read and write head and a rotating data recording medium, and can store data of 100 gigabytes or more. However, a device that has a rotating part like the HDD has a problem in that it wears down over time, and thus, there is a high possibility of operational failure, thereby reducing reliability.

A flash memory which is widely used is an example of non-volatile RAM. However, the flash memory has drawbacks of slow reading and writing speeds and short life span. Due to the drawbacks of the flash memory, new memory devices such as ferroelectric random access memory (FRAM), magnetic random access memory (MRAM), and phase change random access memory (PRAM) have been developed. However, the flash memory, FRAM, MRAM, and PRAM all have small storage capacities when compared to a HDD and have high manufacturing costs.

Therefore, as a method of solving the drawbacks of the conventional non-volatile data storing devices as described above, much research and development with respect to a new data storing device that uses a magnetic domain wall movement has been carried out.

A magnetic domain in a magnetic substance and magnetic domain walls will now be described. Afterwards, a storing device that uses the magnetic domain and the magnetic domain walls will be described.

A minute magnetic region that constitutes a ferromagnetic body is named as a magnetic domain. The rotation of electrons in a magnetic domain, that is, the direction of magnetic moment is identical. The size and magnetization direction of a magnetic domain can be appropriately controlled by the shape and size of a magnetic substance and external energy.

A magnetic domain wall is a boundary portion of a magnetic domain having a magnetization direction different from another magnetic domain. The magnetic domain wall can be moved by an external magnetic field or by a current applied to a magnetic substance.

The principle of the magnetic domain wall movement can be applied to data storing devices such as HDDs. That is, an operation of reading/writing data is possible when the magnetic domains magnetized so as to correspond to specific data in a magnetic substance are moved in order to pass through a read/write head. In this case, a reading/writing operation is possible without directly rotating a recording medium. Accordingly, the problems of wearing down and failure of conventional HDDs can be solved. An example of a data storing device to which the principle of magnetic domain wall movement is applied has been disclosed in U.S. Pat. No. 6,834,005 B1.

Also, the principle of magnetic domain wall movement can be applied to a memory such as a non-volatile RAM. That is, a non-volatile memory device that can write/read a data '0' or '1' can be realized using a principle whereby a voltage in a magnetic substance varies according to the movement of magnetic domain walls in the magnetic substance having magnetic domains magnetized in a specific direction and magnetic domain walls. In this way, since data can be read and written by varying the positions of the magnetic domain walls by flowing a specific current in a line type magnetic substance, a highly integrated device having a simple structure can be realized. Therefore, when the principle of magnetic domain wall movement is used, the manufacture of a memory having a very large storage capacity compared to the conventional FRAM, MRAM, and PRAM is possible.

However, the development of semiconductor devices that use the magnetic domain wall movement is still in an initial stage, and there are a few problems that have yet to be solved in order for them to be used in practice. One of the problems is related to the mobility of the magnetic domain walls. If the movement of the magnetic domain walls is slow, a sufficient speed of reading/writing cannot be achieved. The magnetic domain walls in a magnetic substance must be able to stably move at a high speed in a magnetic field or when a current is applied. However, a physical phenomenon in relation to the speed of movement of the magnetic domain walls has not yet been theoretically clearly identified. Therefore, there is a difficulty in improving the speed of movement of the magnetic domain walls.

SUMMARY OF THE INVENTION

The present invention provides a semiconductor device that uses magnetic domain wall movement to increase reading/writing speeds by improving the speed of movement of magnetic domain walls.

According to an aspect of the present invention, there is provided a semiconductor device that comprises a magnetic substance film in which magnetic domain walls are moved, wherein the magnetic substance film has a damping constant of at least 0.015. The damping constant of magnetic substance film may be in the range of 0.015 to 0.1.

The magnetic substance film may be an alloy in which a non-magnetic substance is included in a magnetic substance.

The magnetic substance film may be an alloy in which a non-magnetic substance is comprised in at least one magnetic substance selected from Ni—Fe, Co, Co—Ni, Co—Fe, and Co—Fe—Ni, and the Ni—Fe may be $Ni_{80}Fe_{20}$.

The non-magnetic substance may be at least one selected from Os, Nb, Ru, Rh, Ta, Pt, Zr, Ti, Pd, B, Zn, and Ag.

The contents of the non-magnetic substance is 0.5 to 10 atom %.

The magnetic substance film may be one selected from Co, CoFe, CoNi, and CoFeNi.

The semiconductor device may further comprise a non-magnetic seed layer on a lower surface of the magnetic substance film.

The non-magnetic seed layer may be formed of one selected from Cu, Os, Ru, Rh, Ta, Pt, Zr, Ti, Pd, B, Zn, and Ag.

The non-magnetic seed layer may have a thickness of 30 to 300 Å.

The semiconductor device may further comprise a non-magnetic capping layer on an upper surface of the magnetic substance film.

The non-magnetic capping layer may be formed of one selected from Cu, Os, Ru, Rh, Ta, Pt, Zr, Ti, Pd, B, Zn, and Ag.

The non-magnetic capping layer may have a thickness of 30 to 300 Å.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF EXEMPLARY EMBODIMENTS OF THE INVENTION

A semiconductor device that uses magnetic domain wall movement according to an exemplary embodiment of the present invention will now be described more fully with reference to the accompanying drawings.

First, a theoretical principle of the present invention will be described.

In order to investigate the movement phenomenon of magnetic domain walls within a magnetic field, the following experiments were conducted. Through the experiments, the causes of interference with the movement of the magnetic domain walls and a method of improving the speed of movement of the magnetic domain walls were found.

Figure 1:
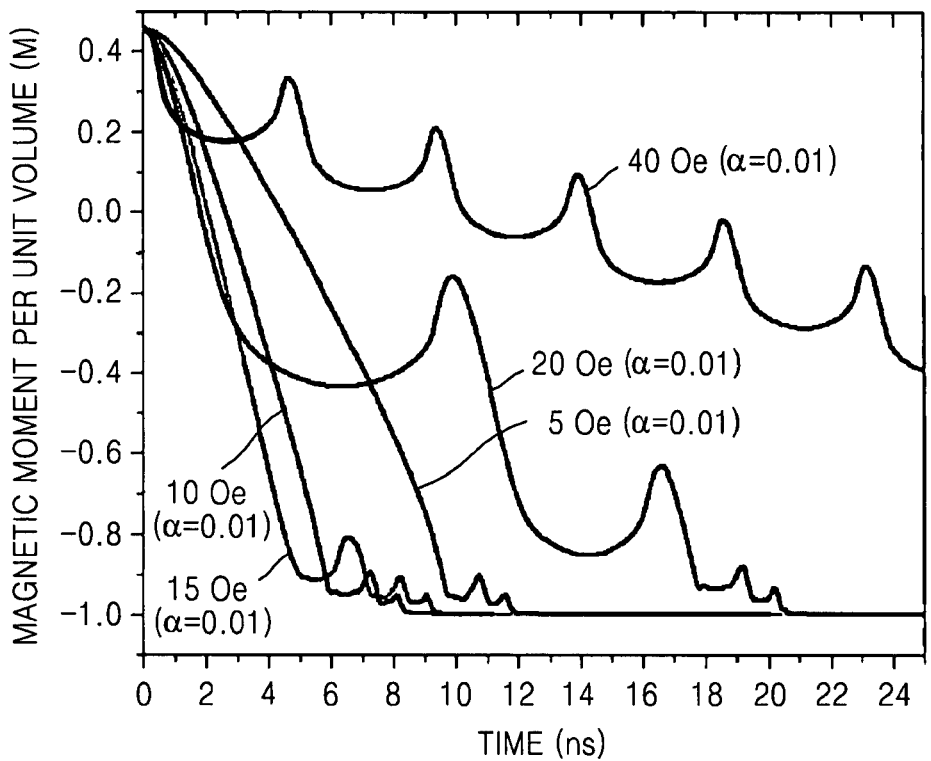
FIG. 1 is a magnetization-time (M-T) graph showing a magnetization characteristic of magnetic substance samples having a fixed damping constant according to the variation in magnetic field.

First, the movement phenomenon of magnetic domain walls in five magnetic substance samples having an identical damping constant and each having two magnetic domains in different directions from each other was examined by applying magnetic fields that were different from each other. The results are shown in FIG. 1. At this time, each of the magnetic substance samples is a bar type and includes magnetic domains magnetized in opposite directions from each other along a longitudinal direction, and the damping constant of the samples was 0.01. The magnetic fields were applied to the samples in one of the longitudinal directions of the bar with a magnitude of 5, 10, 15, 20, and 40 oersted (Oe).

Referring to FIG. 1, as the magnitude of the magnetic field increases from 5 Oe to 15 Oe, the speed of converging to a magnetic moment value per unit volume (magnetization value: M) of −1.0 tends to increase. This denotes that magnetization rapidly progresses due to the increase in the speed of movement of the magnetic domain walls as the magnitude of the magnetic field increases. However, when the magnitude of the magnetic field increases to 20 Oe or more, the magnetization curve oscillates largely and the time taken to converge to the magnetization value M of −1.0 takes approximately 20 ns. When the magnitude of the magnetic field increases to 40 Oe, the time taken to converge to the magnetization M of −1.0 is much longer than 20 ns. The reason why the time taken to converge to the magnetization value M of −1.0 is slow when the magnitude of the magnetic field is over 20 Oe is because the magnetic domain walls oscillate. That is, when the magnitude of the magnetic field increases to a value greater than a specific value, the movement speed of the magnetic domain walls is slow due to the oscillation effect of the magnetic domain walls.

Figure 2A:
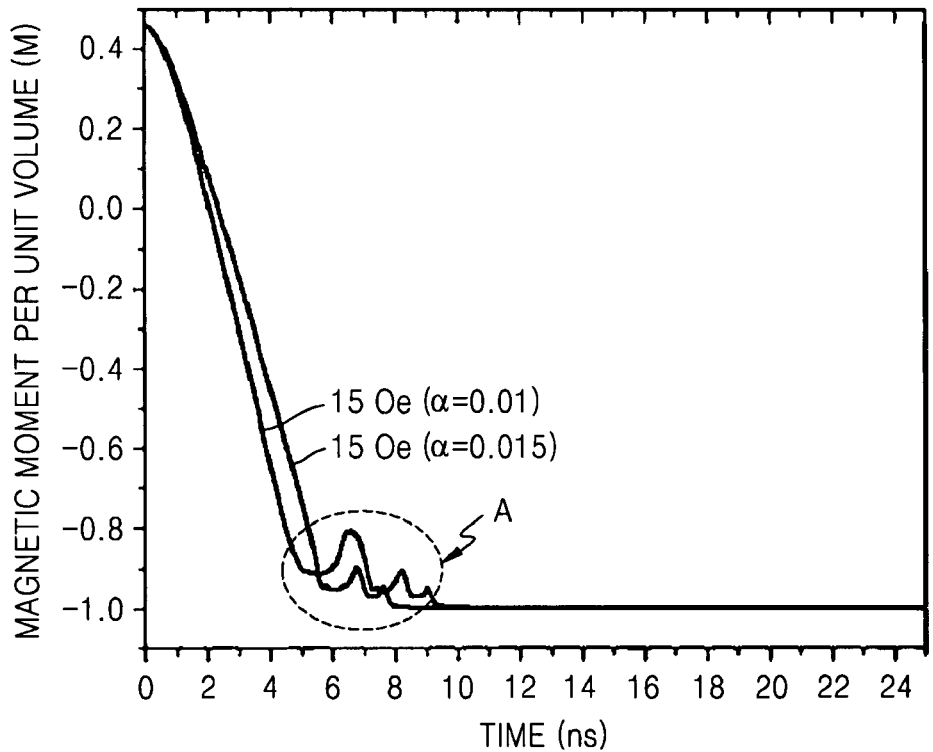
FIGS. 2A through 2C are M-T graphs showing magnetization characteristics of magnetic substance samples according to the variation in damping constant and magnetic field.
Figure 2B:
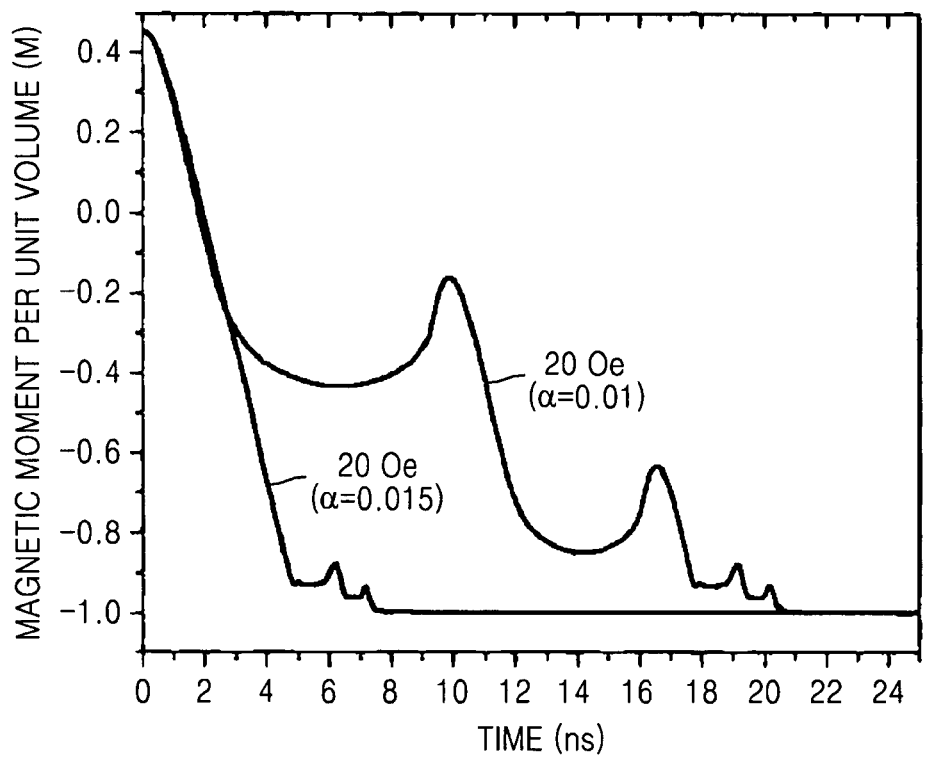
Figure 2C:
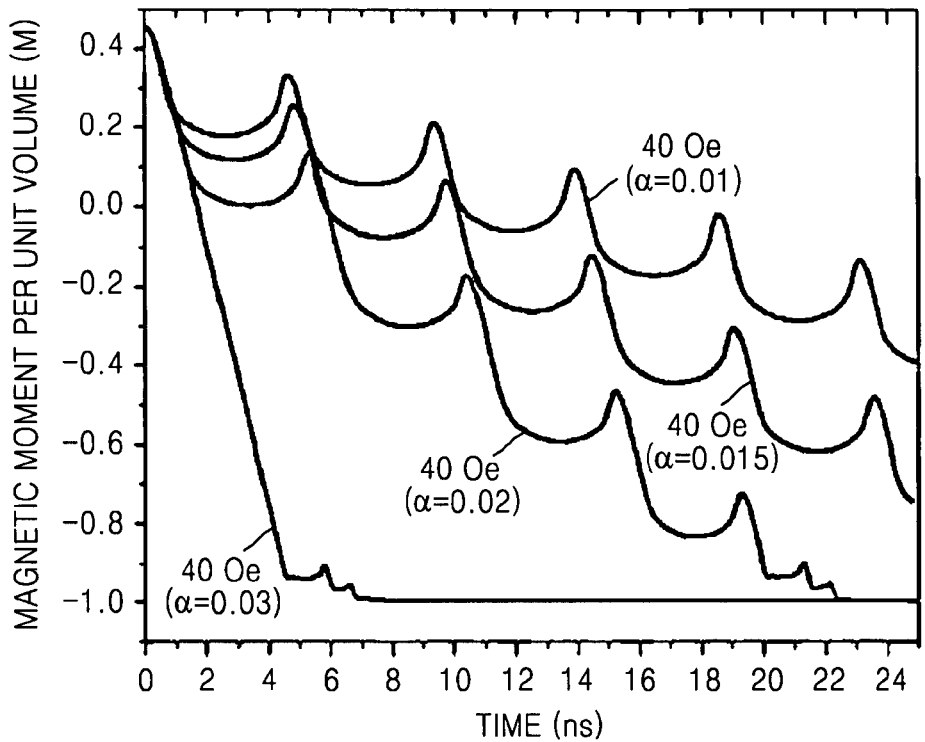

In order to identify the cause of the slow movement of the magnetic domain walls, a plurality of magnetic substance samples having different damping constants were examined by applying magnetic fields. The results are shown in FIGS. 2A through 2C. The basic shapes of the magnetic substance samples and the direction of the magnetic fields are identical to the magnetic substance samples described with reference to FIG. 1, and the damping constant of each magnetic substance sample and the condition of applying the magnetic fields are indicated in each graph.

Referring to FIG. 2A, when a magnetic field of 15 Oe is applied to the magnetic substance samples, it is found that a sample having a damping constant (α) of 0.015 shows a slightly higher magnetization speed than a sample having a damping constant of 0.01. The sample having a damping constant of 0.015 also shows a less minute oscillation of a magnetization curve than the sample having a damping constant of 0.01 at region A where the magnetic moment value M approaches −0.1.

Referring to FIG. 2B, when a magnetic field of 20 Oe is applied to the magnetic substance samples, the magnetization speed of a sample having a damping constant of 0.01 is 20 ns, but the magnetization speed of a sample having a damping constant of 0.015 is 7 to 8 ns. That is, it is determined that as the damping constant increases from 0.01 to 0.015, the oscillation of the magnetization curve is greatly reduced and the speed of movement of the magnetic domain walls greatly increases.

Referring to FIG. 2C, when a magnetic field of 40 Oe is applied to the magnetic substance samples, as the damping constant increases from 0.01 through 0.015 to 0.02, the magnetization speed gradually increases, but the oscillation of the magnetization curve is maintained almost the same. However, in the case of a sample having a damping constant of 0.03, although a magnetic field of 40 Oe is applied, it is seen that the oscillation of the magnetization curve barely occurs and the magnetization speed increases to a similar level to the magnetization curve in FIG. 2A. In this case, the oscillation of the magnetic domain walls barely occurs.

From the experimental results of FIG. 1 and FIGS. 2A through 2C, it is determined that the movement of the magnetic domain walls is interfered with the oscillation effect of the magnetic domain walls, and the oscillation effect of the magnetic domain walls can be removed by increasing the damping constant of a magnetic substance.

Here, the damping constant is a constant relating to the degree of distribution of energy applied to the magnetic substance, and it is indicated as a in the Landau-Lifshitz-Gilbert equation (Equation 1) given below.

$$\frac{dM}{dt} = -|\gamma|(M \times H_{\text{eff}}) + \frac{\alpha}{M_s}\left(M \times \frac{dM}{dt}\right) \quad \text{[Equation 1]}$$

In Equation 1, M indicates magnetization, which is a magnetic moment per unit volume, γ indicates a gyromagnetic ratio, $H_{\text{eff}}$ indicates an effective magnetic field applied to the samples, and $M_s$ indicates saturation magnetization.

The increase in the damping constant α in equation 1, as proved in the above experiments, causes a reduction in the magnetic resonance of magnetic domain walls by dissipating energy from a magnetic field applied to the sample. That is, as the damping constant α increases, the oscillation of the magnetic domain walls reduces, thereby increasing the magnetization speed.

Therefore, in an exemplary embodiment of the present invention, the oscillation of the magnetic domain walls is reduced by using a magnetic substance film having a damping constant of at least 0.015, and more specifically, in a range from 0.015 to 0.1 for a semiconductor device that uses the magnetic domain wall movement. In this way, the magnetic domain walls can stably move at a high speed. Accordingly, an exemplary embodiment of the present invention can provide a semiconductor device that can greatly increase an operating speed using magnetic domain wall movement. A semiconductor device that uses the magnetic domain wall movement can be a data storing device like a HDD, a memory device like a RAM, or a logic device.

Exemplary embodiments of the present invention provide three methods of increasing the damping constant of a magnetic substance film as follows.

First, a damping constant of a magnetic substance film can be increased to 0.015 or more by using an alloy in which a non-magnetic substance is included in the magnetic substance. The magnetic substance can be one selected from Ni—Fe, Co, Co—Ni, Co—Fe, and Co—Fe—Ni, and the non-magnetic substance can be one selected from Os, Nb, Ru, Rh, Ta, Pt, Zr, Ti, Pd, B, Zn, and Ag. The contents of the non-magnetic substance can be 0.5 to 10 atom %.

As the amount of osmium added to $Ni_{80}Fe_{20}$ (Py), which is a magnetic substance, increases, a damping constant α of the magnetic substance increases.

Second, a damping constant of a magnetic substance can be increased to 0.015 or more by including a non-magnetic substance film on at least one of an upper surface and a lower surface of a magnetic substance film. At this time, the non-magnetic substance film included on the lower surface of the magnetic substance film can be named as a non-magnetic seed layer, and the non-magnetic substance film included on the upper surface of the magnetic substance film can be named as a non-magnetic capping layer. The non-magnetic seed layer or the non-magnetic capping layer can be formed to a thickness of 30 to 300 Å using a substance selected from Cu, Os, Ru, Rh, Ta, Pt, Zr, Ti, Pd, B, Zn, and Ag.

In an N—Py—N structure in which both a non-magnetic seed layer and a non-magnetic capping layer are included on a magnetic substance film formed of Py, as the thickness of a non-magnetic substance film (the non-magnetic seed layer or the non-magnetic capping layer) increases, a damping constant α of the magnetic substance film increases. Here, N is a non-magnetic substance film formed of Pt, Pd, Ta, or Cu. That is, the non-magnetic substance films included on the upper and lower surfaces of the magnetic substance film causes an increase in the damping constant α.

Third, the speed of movement of magnetic domain walls can be increased in order to meet an aspect of the present invention by using a magnetic substance film intrinsically having a damping constant of at least 0.015, for example, Co, CoFe, CoNi, or CoFeNi. In this case, an improvement in the operation speed of a semiconductor device due to the improved speed of movement of the magnetic domain walls can be obtained without including a non-magnetic substance in the magnetic substance film or additionally including the non-magnetic substance films on the upper and lower surfaces of the magnetic substance film. However, a damping constant α that is further increased can be obtained and can maximize the effect of an exemplary embodiment the present invention by additionally using the first and second methods.

Figure 3:
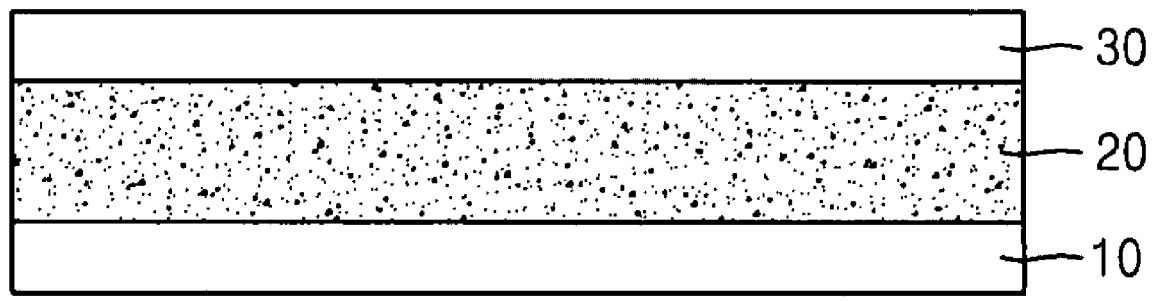
FIG. 3 is a cross-sectional view illustrating a semiconductor device that uses magnetic domain wall movement according to an exemplary embodiment of the present invention.

FIG. 3 is a cross-sectional view illustrating a semiconductor device that uses magnetic domain wall movement according to an exemplary embodiment of the present invention. Reference numerals 10, 20, and 30 respectively indicate a non-magnetic seed layer, a magnetic substance film, and a non-magnetic capping layer. Here, the magnetic substance film 20 has a damping constant of 0.015 to 0.1, and can include a non-magnetic substance such as Os, Nb, Ru, Rh, Ta, Pt, Zr, Ti, Pd, B, Zn, or Ag. The non-magnetic seed layer 10 and the non-magnetic capping layer 30 are optional constituent elements.

As described above, according to exemplary embodiments of the present invention, the speed of movement of magnetic domain walls can be greatly increased using a magnetic substance, which has a damping constant of at least 0.015, as a magnetic substance film of a semiconductor device that uses a principle of magnetic domain wall movement.

Accordingly, the present invention facilitates a rapid and stable movement of magnetic domain walls in a semiconductor device to which magnetic domain wall movement can be applied, for example, a data storing device such as a HDD, a memory device such as a non-volatile RAM, or a logic device, thereby greatly increasing operation speed of the semiconductor device.

While this invention has been particularly shown and described with reference to exemplary embodiments thereof, it will be understood by those skilled in the art that various changes in form and details may be made therein without departing from the spirit and scope of the invention as defined by the appended claims.

The magnetic substance film having a high damping constant, which is proposed in the present invention, can be applied to various semiconductor devices including a data storing device such as a HDD, a memory device such as an RAM, or a logic device, and in some cases, the kind of the magnetic substance films and a constituent element added to the magnetic substance film can differ from those described herein. Therefore, the scope of the invention is defined not by the detailed description of the invention but by the appended claims.

What is claimed is:

1. A semiconductor device that comprises a magnetic substance film in which magnetic domain walls are moved, wherein the magnetic substance film has a damping constant of at least 0.015, and the magnetic substance film is an alloy in which a non-magnetic substance is included in a magnetic substance.

2. The semiconductor device of claim 1, wherein the non-magnetic substance is at least one selected from Os, Nb, Ru, Rh, Ta, Pt, Zr, Ti, Pd, B, Zn, and Ag.

3. The semiconductor device of claim 1, wherein the magnetic substance film comprises 0.5 to 10 atom % of the non-magnetic substance.

4. The semiconductor device of claim 1, wherein the magnetic substance is at least one selected from Ni—Fe, Co, Co—Ni, Co—Fe, and Co—Fe—Ni.

5. The semiconductor device of claim 4, wherein the Ni—Fe is $Ni_{80}Fe_{20}$.

6. The semiconductor device of claim 4, wherein the non-magnetic substance is at least one selected from Os, Nb, Ru, Rh, Ta, Pt, Zr, Ti, Pd, B, Zn, and Ag.

7. The semiconductor device of claim 4, wherein the magnetic substance film comprises 0.5 to 10 atom % of the non-magnetic substance.

8. The semiconductor device of claim 1, wherein the magnetic substance film has a damping constant of not more than 0.1.

9. A semiconductor device that comprises a magnetic substance film in which magnetic domain walls are moved, wherein the magnetic substance film has a damping constant of at least 0.015, and the magnetic substance film is one selected from Co, CoFe, CoNi, and CoFeNi.

10. The semiconductor device of claim 9, wherein the magnetic substance film has a damping constant of not more than 0.1.

11. A semiconductor device that comprises a magnetic substance film in which magnetic domain walls are moved, wherein the magnetic substance film has a damping constant of at least 0.015, and a non-magnetic layer is provided on at least one of a lower surface and an upper surface of the magnetic substance film.

12. The semiconductor device of claim 11, wherein the non-magnetic layer is formed of one selected from Cu, Os, Ru, Rh, Ta, Pt, Zr, Ti, Pd, B, Zn, and Ag.

13. The semiconductor device of claim 11, wherein the non-magnetic layer has a thickness of 30 to 300 Å.

14. The semiconductor device of claim 11, wherein the magnetic substance film has a damping constant of not more than 0.1.

* * * * *